United States Patent
Bu (10) Patent No.: US 7,471,572 B1
(45) Date of Patent: Dec. 30, 2008

(54) SYSTEM AND METHOD FOR ENHANCING ERASE PERFORMANCE IN A CMOS COMPATIBLE EEPROM DEVICE

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/644,394

(22) Filed: Dec. 21, 2006

(51) Int. Cl.
*G11C 11/34* (2006.01)

(52) U.S. Cl. .............................. 365/185.29; 365/185.22

(58) Field of Classification Search ............ 365/185.29, 365/185.22
See application file for complete search history.

(56) References Cited

U.S. PATENT DOCUMENTS 6,020,231 A * 2/2000 Wang et al. ................. 438/228
6,191,980 B1   2/2001 Kelley et al.
6,897,727 B2 * 5/2005 Mallinson ................... 330/253

OTHER PUBLICATIONS

Kee-Yeol Na et al., "High-Performance Single Polysilicon EEPROM With Stacked MIM Capacitor," IEEE Electron Device Letters, vol. 27, No. 4, Apr. 2006, pp. 294-296.

* cited by examiner

*Primary Examiner*—Michael T Tran (57) ABSTRACT

A system and method are disclosed for enhancing the performance of erase operations in CMOS compatible EEPROM memory cells. An EEPROM memory cell is described in which the erase voltage and the coupling ratio of the EEPROM memory cell are simultaneously decreased while maintaining the erase performance (e.g., erase speed) of the EEPROM memory cell. Significant improvement in the endurance of CMOS compatible EEPROM devices is obtained due to the enhanced erase performance of the EEPROM memory cells of the present invention.

20 Claims, 6 Drawing Sheets

SYSTEM AND METHOD FOR ENHANCING ERASE PERFORMANCE IN A CMOS COMPATIBLE EEPROM DEVICE

TECHNICAL FIELD OF THE INVENTION

The present invention is generally directed to the manufacture of integrated circuits and, in particular, to a system and method for enhancing erase performance in an electrically erasable programmable read only memory (EEPROM) device.

CROSS REFERENCE TO RELATED APPLICATIONS

The present invention is related to an invention disclosed and claimed in U.S. patent application Ser. No. 11/389,984 filed Mar. 27, 2006 entitled "System and Method for Providing a CMOS Compatible Single Poly EEPROM with an NMOS Program Transistor." The present invention is also related to an invention disclosed and claimed in U.S. patent application Ser. No. 11/591,853 filed Nov. 2, 2006 entitled "System and Method for Providing High Endurance Low Cost CMOS Compatible EEPROM Devices."

BACKGROUND OF THE INVENTION

A fundamental design challenge in creating a memory cell of an electrically erasable programmable read only memory (EEPROM) device is to use a controllable and reproducible electrical effect that has sufficient non-linearity so that the memory cell (1) can be written to (or erased) at one voltage in less than one millisecond (1 ms) and can be read at another voltage, and (2) the data within the memory cell must remain unchanged for more than ten (10) years.

Prior art stacked/split gate EEPROM technology requires (1) special multi-polysilicon materials, (2) different gate oxide thicknesses, and (3) modified doping profiles. These prior art requirements create process complexity and high cost when embedded into a complementary metal oxide semiconductor (CMOS) process.

Figure 1:
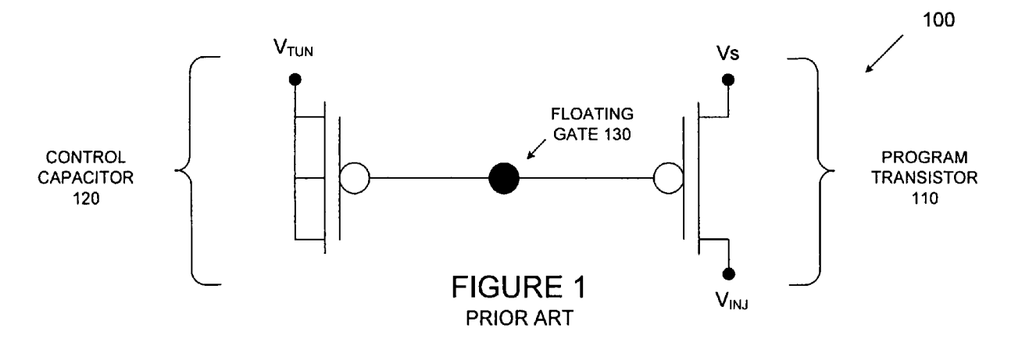
FIG. 1 illustrates a schematic diagram of a prior art memory cell of an electrically erasable programmable read only memory (EEPROM) device that comprises a control capacitor and a program transistor.

FIG. 1 illustrates a schematic diagram of a prior art memory cell 100 of an electrically erasable programmable read only memory (EEPROM) device. Memory cell 100 comprises one P-channel metal oxide semiconductor (PMOS) transistor 110 and one P-channel metal oxide semiconductor (PMOS) capacitor 120. The PMOS capacitor 120 is formed by connecting together the source, drain and substrate of a PMOS transistor.

The PMOS transistor 110 may be referred to as PMOS program transistor 110. The PMOS capacitor 120 may be referred to as PMOS control capacitor 120. The gate of the PMOS program transistor 110 and the gate of the PMOS control capacitor 120 are connected together (i.e., shorted together) and are isolated from the other active elements. The shorted gates of the PMOS program transistor 110 and the PMOS control capacitor 120 are collectively referred to as a "floating gate" 130. Charges (in amounts that represent either a zero ("0") representation or a one ("1") representation) may be written to the floating gate 130. In order to avoid well bias interference, the PMOS program transistor 110 and the PMOS control capacitor 120 are each located in a separate N well.

The prior art memory cell 100 is written to by injecting drain avalanche hot electrons into the floating gate 130. For PMOS operation (as shown in FIG. 1) low voltage is applied to the control gate and drain of PMOS control capacitor 120 and high voltage is applied to the source/well of PMOS program transistor 110. The channel of PMOS program transistor 110 is turned on and hot electrons are generated at the high electric field region at the drain junction (designated "$V_{INJ}$" in FIG. 1). With positive voltage on the control gate of PMOS control transistor 120, some hot electrons with high energy will pass through the silicon-silicon dioxide ($Si$—$SiO_2$) potential barrier and be injected into the floating gate 130.

The prior art memory cell 100 is erased by applying a high voltage to the control gate of the PMOS control transistor 120 and to the ground drain and source of the PMOS program transistor 110. Electrons on the floating gate 130 will pass through the gate oxide between the floating gate 130 and the control gate of the PMOS control capacitor 120 by Fowler-Nordheim (FN) tunneling process and go to the substrate. A description of the physics of the Fowler-Nordheim (FN) tunneling process is set forth in U.S. Pat. No. 5,225,362.

During programming, most control gate voltage should be coupled between the floating gate 130 and the drain/source of the PMOS program transistor 110 to facilitate electron injection to the floating gate 130 but not further to the control gate of the PMOS control transistor 120. This requires the capacitance between the floating gate 130 and the control gate to be large. On the other hand, during the erase procedure, more control gate voltage should be coupled between the floating gate 130 and the control gate, so that electrons can tunnel from the floating gate 130 to the substrate by the Fowler-Nordheim (FN) tunneling process. This requires the capacitance between the floating gate 130 and the control gate to be small.

These two contradictory requirements for the control gate capacitance during the program procedure and the erase procedure leave a narrower operation window. This results in poor data retention and slower speeds for an EEPROM that comprises one PMOS program transistor and one PMOS control capacitor.

To improve the operational speed and data retention for an EEPROM device, EEPROM designers have sometimes placed an additional capacitor in the basic memory cell. This approach has one large capacitor for the programming operation and one small capacitor for the erase operation. Capacitor coupling techniques are used to achieve a favorable electric field for both the programming operation and the erase operation.

The floating gate of an added capacitor has to be filled with hot electrons. Hot electrons that pass through gate oxide will create oxide damage. Oxide damage degrades the endurance of a memory cell. Endurance is measured by how many program/erase cycles the gate oxide can tolerate before unacceptable damage occurs. Therefore, one major drawback to adding an extra capacitor is that it degrades EEPROM memory cell endurance performance.

Another drawback to adding an extra capacitor is that it significantly increases the size of the basic memory cell. This significantly lowers the EEPROM array density. Additional chip area is required for the extra capacitors. This increases the cost.

Another drawback of prior art CMOS EEPROM technology is the speed of the programming procedure. The programming procedure is carried out by utilizing drain avalanche hot electrons. Because the efficiency of generating and injecting the drain avalanche hot electrons is low, programming times are relatively long. The programming time is usually one hundred milliseconds (100 ms) or longer. Even the improved coupling provided by using additional capacitors only reduces the programming time to about twenty milliseconds (20 ms).

Figure 2:
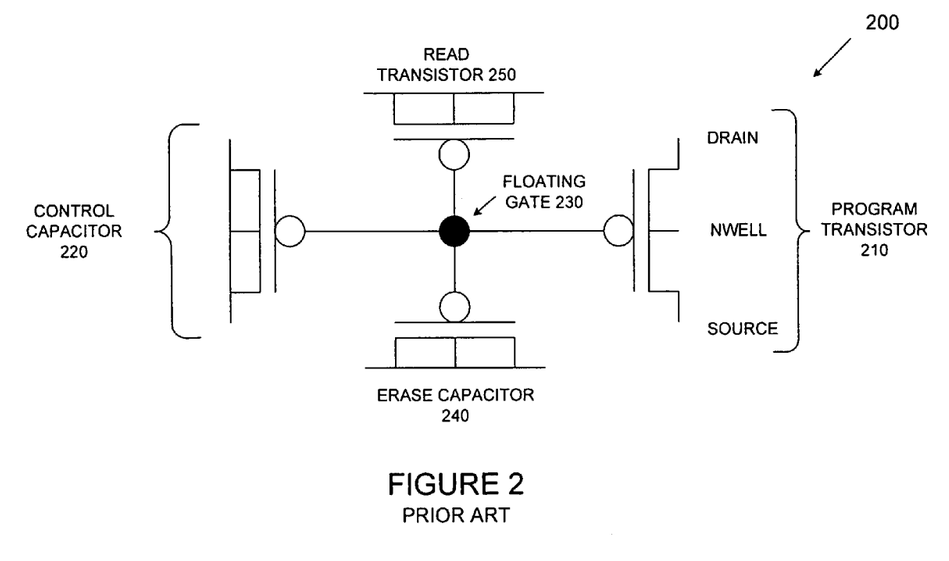
FIG. 2 illustrates a schematic diagram of a prior art memory cell of an electrically erasable programmable read only memory (EEPROM) device that comprises a control capacitor, an erase capacitor, a program transistor, and a read transistor.

FIG. 2 illustrates a schematic diagram of a prior art memory cell 200 of an erasable programmable read only memory (EEPROM) device that comprises a control capacitor and an erase capacitor. Memory cell 200 comprises program transistor 210, control capacitor 220, floating gate 230, erase capacitor 240 and read transistor 250 coupled together as shown in FIG. 2.

Prior art memory cell 200 operates in the same manner as that described for prior art memory cell 100. That is, the gate of the PMOS program transistor 210 and the gate of the PMOS control capacitor 220 are connected together (i.e., shorted together) and are isolated from the other active elements. The shorted gates of the PMOS program transistor 210 and the PMOS control capacitor 220 are collectively referred to as a "floating gate" 230. Charges (in amounts that represent either a "zero" ("0") representation or a "one" ("1") representation) may be written to the floating gate 230.

Prior art memory cell 200 comprises a PMOS erase capacitor 240 to facilitate the erase operation. The gate of the PMOS erase capacitor 240 is also connected to the floating gate 230. Prior art memory cell 200 also comprises a PMOS read transistor 250 to facilitate the read operation. The gate of the PMOS read transistor 250 is also connected to the floating gate 230. The PMOS read transistor 250 has nothing to do with the program/erase operations of memory cell 200.

The programming operation is carried out by Drain Avalanche Hot Carrier (DAHC) electron injection. Electrons from the edge of the drain junction of the program transistor 210 are injected into the floating gate 230. The erase operation is carried out by Fowler-Nordheim (FN) tunneling. Electrons from the floating gate 230 tunnel to the substrate of the erase capacitor 240.

Figure 3:
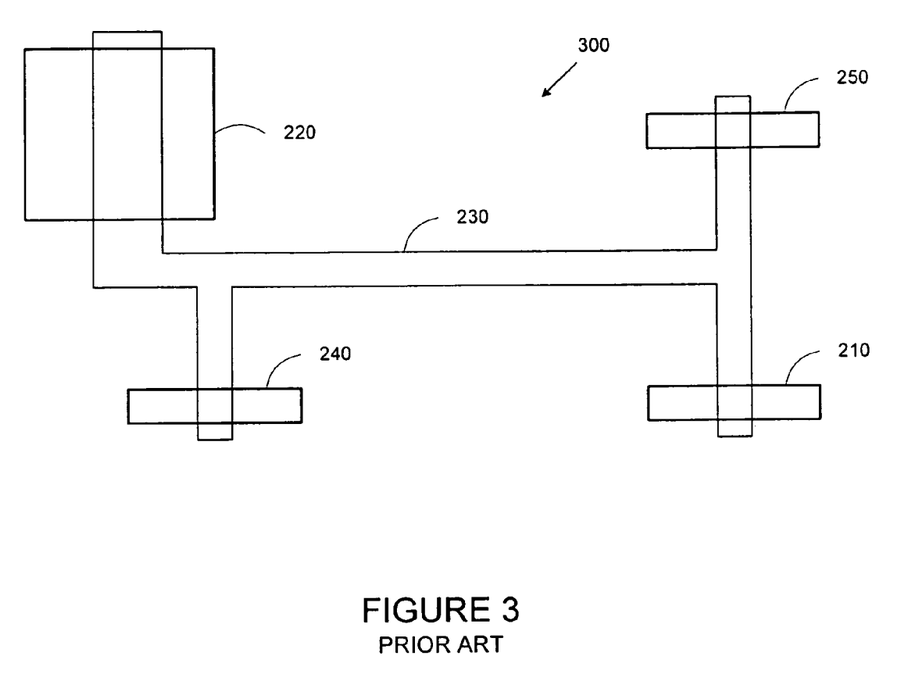
FIG. 3 illustrates a plan view of a memory cell layout design of the prior art memory cell shown in FIG. 2.

FIG. 3 illustrates an illustrative memory cell layout design 300 for memory cell 200. The program transistor 210 and the erase capacitor 240 and the read transistor 250 are the same size. The program transistor 210 has an area ratio of one to twenty seven (1:27) with respect to the area of the control capacitor 220. During the operation of memory cell 200 this relatively high value for the coupling ratio helps lower the value of the erase voltage and the value of the program voltage.

However, the relatively high value for the coupling ratio leads to excess oxide damage. This is because (1) the large control capacitor 220 has to be filled up from a small hot electron injection point, and (2) during the erase process all the electrons stored on the large control capacitor 220 must be removed from a small erase point. This is one of the major reasons that complementary metal oxide semiconductor (CMOS) non-volatile memory (NVM) memory cells usually are capable of only one thousand (1,000) or so program/erase cycles.

In order to lower the operating voltage, particularly the Fowler-Nordheim (FN) tunneling voltage that is commonly used in erase operations, the coupling ratio between the control capacitor 220 and the erase capacitor 240 must be high. The coupling ratio is usually more than ten to one (10:1). In the example shown in FIG. 3, the coupling ratio between the control capacitor 220 and the erase capacitor 240 is twenty-seven to one (27:1). That is, the area of the control capacitor 220 is twenty seven (27) times the area of the erase capacitor 240.

Adding in the effect of the area of the floating gate 230 can increase the coupling ratio to as much as fifty to one (50:1). During the erase procedure the electrons that are stored in the area of the control capacitor 220 and in the area of the floating gate 230 will need to discharge through a much smaller erase area in the erase capacitor 240. This means that many electrons will need to pass through the gate oxide of the erase capacitor 240.

In mainstream stacked gate flash memory the control ratio is usually about one and two tenths to one (1.2:1). This is a fundamental reason that stacked gate flash memory can have an endurance of up to one hundred thousand (100,000) program/erase cycles. As previously mentioned, the endurance of CMOS compatible non-volatile memory (NVM) memory cells is usually only about one thousand (1,000) program/erase cycles.

Therefore, there is a need in the art for a system and method for enhancing the erase performance of a CMOS compatible non-volatile memory (NVM) memory cell of an EEPROM device. In particular, there is a need in the art for a system and method that is capable of simultaneously decreasing the erase voltage and decreasing the coupling ratio (while maintaining the erase speed) in a CMOS compatible non-volatile memory (NVM) memory cell of an EEPROM device.

The present invention provides a CMOS compatible EEPROM memory cell that comprises three CMOS N type (NMOS) transistors. The first NMOS transistor serves as a control capacitor, the second NMOS transistor serves as an erase capacitor, and the third NMOS transistor serves as a program capacitor. The gates of the three NMOS transistors are connected together to form a floating gate.

The size of the control capacitor is selected to provide a coupling ratio between the control capacitor and the erase capacitor that has a value of approximately two to one. Each NMOS transistor of the CMOS compatible EEPROM memory cell is isolated from an underlying P substrate by a Deep N Well isolation structure. This allows the well bias voltage to be isolated from other active elements on the semiconductor wafer.

Bias voltages are applied to the P well of the control capacitor and to the P well of the erase capacitor. The EEPROM memory cell of the present invention is erased with a Fowler-Nordheim (FN) tunneling current that is obtained by using a lower amplitude of erase voltage and a lower coupling ratio compared to prior art methods. This results in a significant improvement in the endurance of the EEPROM memory cell as measured by the number of program/erase cycles that the EEPROM memory cell can perform.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

FIGS. 4 through 9, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged electrically erasable programmable read only memory (EEPROM) device.

Figure 4:
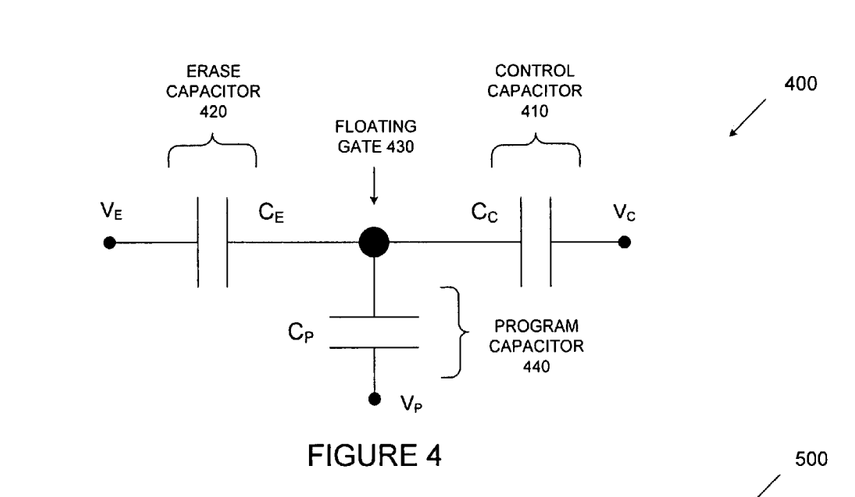
FIG. 4 illustrates a schematic diagram of an electrically erasable programmable read only memory (EEPROM) device of the present invention that comprises a control capacitor, an erase capacitor and a program capacitor.

FIG. 4 illustrates a schematic diagram of one advantageous embodiment of a memory cell 400 of an electrically erasable programmable read only memory (EEPROM) device of the present invention. Memory cell 400 comprises control capacitor 410, erase capacitor 420, floating gate 430, and program capacitor 440 coupled together as shown in FIG. 4. The program capacitor 440 also performs the function of a read transistor for the memory cell 400. As will be more fully described below, the coupling ratio of the control capacitor 410 to the erase capacitor 420 is two to one (2:1).

The control capacitor 410, the erase capacitor 420, and the program capacitor 440 of memory cell 400 are each implemented as an N type metal oxide semiconductor (NMOS) transistor. An NMOS transistor has better gate oxide integrity (GOI) than a P type metal oxide semiconductor (PMOS) transistor. The gate of the NMOS transistor of the control capacitor 410 and the gate of the NMOS transistor of the erase capacitor 420 and the gate of the NMOS transistor of the program capacitor 440 are connected together (i.e., shorted together) and are isolated from the other active elements. The shorted gates of the three NMOS transistors that comprise the control capacitor 410, erase capacitor 420 and program capacitor 440 are collectively referred to as a "floating gate" 430. Charges (in amounts that represent either a "zero" ("0") representation or a "one" ("1") representation) may be written to the floating gate 430.

The capacitance of the control capacitor 410 is designated with the symbol $C_C$. The voltage node to the control capacitor 410 is designated with the symbol $V_C$. The capacitance of erase capacitor 420 is designated with the symbol $C_E$. The voltage node to the erase capacitor 420 is designated with the symbol $V_E$. The capacitance of program capacitor 440 is designated with the symbol $C_P$. The voltage node to the program capacitor 440 is designated with the symbol $V_P$.

Figure 5:
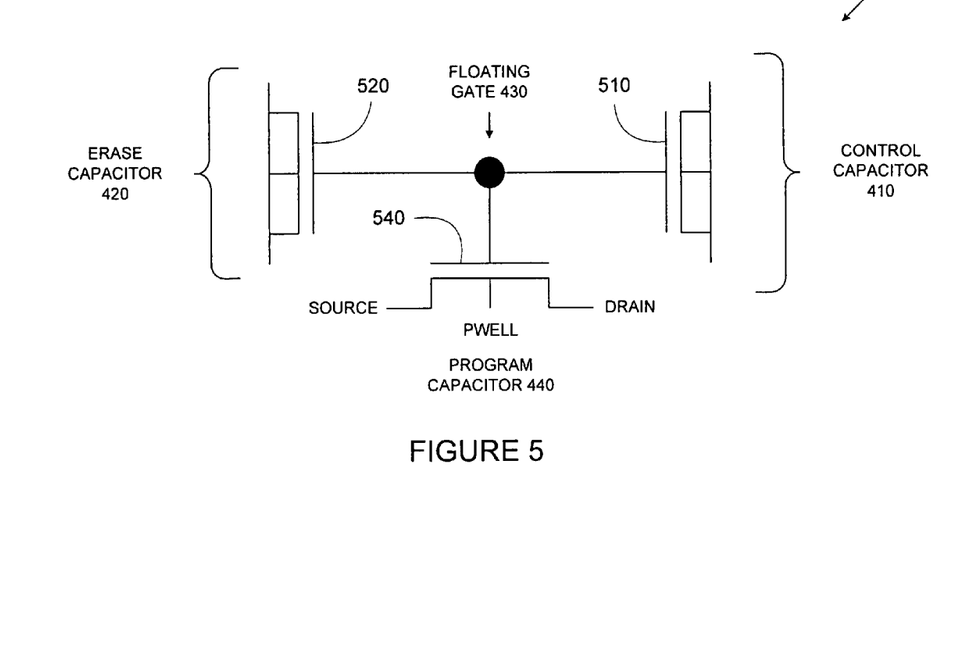
FIG. 5 illustrates a schematic diagram of an electrically erasable programmable read only memory (EEPROM) device of the present invention showing NMOS transistors that form the control capacitor, the erase capacitor and the program capacitor of FIG. 4.

The three NMOS transistors are shown in FIG. 5 where the memory cell is designated with reference numeral 500. The control capacitor 410 comprises an NMOS transistor 510 in which the source and the drain and the P well of the NMOS transistor 410 are tied together. The erase capacitor 420 comprises an NMOS transistor 520 in which the source and the drain and the P well of the NMOS transistor 520 are tied together.

The program capacitor 440 comprises an NMOS transistor 540 in which the source and the P well of the NMOS transistor 540 are connected to a first terminal of the NMOS transistor 540. The drain of the NMOS transistor 540 is separately connected to a second terminal of the NMOS transistor 540. During the programming operation, the same bias voltage $V_P$ is applied to the source and to the drain and to the P well of the NMOS transistor 540. This effectively causes the NMOS transistor 540 to function as a capacitor during the programming operation.

However, during the read operation, however, the NMOS transistor 540 operates as a read transistor. This means that the program capacitor 440 has a dual function. During the programming operation, the NMOS transistor 540 performs the programming function as a program capacitor. During the read operation, the NMOS transistor 540 performs the read function as a read transistor. This dual-purpose design for NMOS transistor 540 saves one extra read transistor for each memory cell. This results in a smaller memory cell size and a larger EEPROM array density.

The size of the erase capacitor 420 and the size of the program capacitor 440 are designed to be smaller than the size of the control capacitor 410. For example, in one advantageous embodiment of the present invention, the size of the control capacitor 410 is two (2) times larger than the size of the erase capacitor 420 and also two (2) times larger than the program capacitor 440. The fact that the size of the program capacitor 440 is twice the size of the erase capacitor 420 provides a relatively small coupling ratio of two to one (2:1). This value of coupling ratio is significantly smaller than the coupling ratios of prior art CMOS compatible EEPROM devices.

The programming operation of the memory cell 400 (or equivalent memory cell 500) is carried out by Fowler-Nordheim (FN) tunneling. The erase operation is also carried out by Fowler-Nordheim (FN) tunneling. The voltage on floating gate 430 is designated as $V_{FG}$. The magnitude of the floating gate voltage $V_{FG}$ is given by:

$$V_{FG} = V_C \left( \frac{C_C}{C_C + C_P} \right) \qquad \text{Eq. (1)}$$

where $V_C$ is the control capacitor voltage $V_C$, and $C_C$ is the control capacitor capacitance $C_C$, and $C_P$ is the program capacitor capacitance $C_P$. The tunneling current into the floating gate 430 increases exponentially with the applied electric field E in accordance with the following expression for current density:

$$J = AE^2 \exp\left(-\frac{B}{E}\right) \quad \text{Eq. (2)}$$

where A and B are constants.

Figure 6:
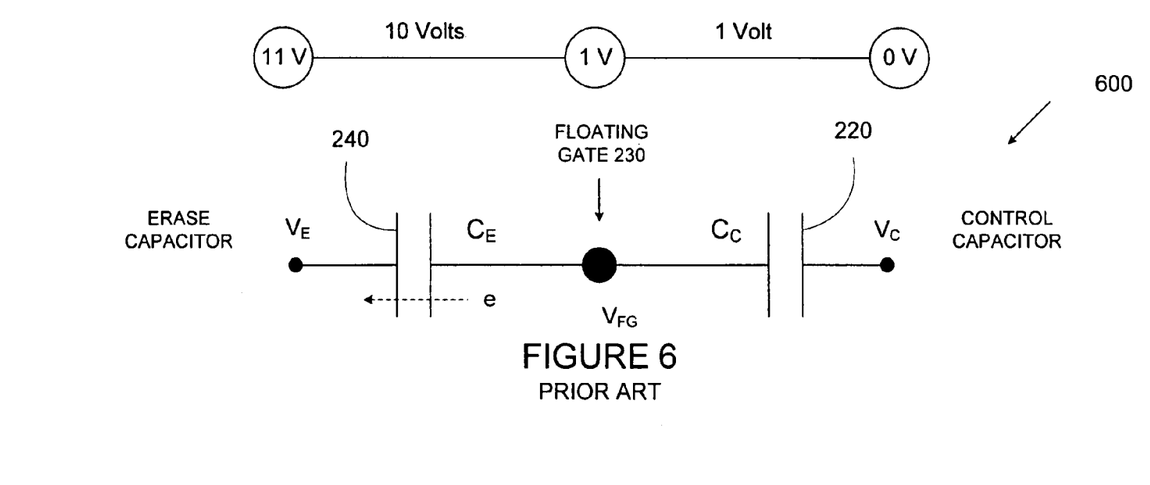
FIG. 6 illustrates a schematic diagram of a portion of a prior art memory cell showing an erase operation.

FIG. 6 illustrates a schematic diagram 600 of a portion of the prior art memory cell 200 showing an erase operation for a PMOS based CMOS compatible EEPROM device. As shown in FIG. 6, in order to get ten volts (10 V) across the erase capacitor 240, the prior art memory cell 200 requires (1) eleven volts (11 V) on the gate terminal $V_E$ of the erase capacitor 240 and (2) a control capacitor 220 that has an area that is ten (10) times larger than the area of the erase capacitor 240 in order to couple one volt (1 V) on the floating gate 230.

As shown in FIG. 6, the voltage drop across the erase capacitor 240 is ten volts (10 V) (i.e., eleven volts (11 V) minus one volt (1 V)). This creates an electric field of ten megavolts per centimeter (10 MV/cm) across a gate oxide layer in the erase capacitor 240 that is one hundred Angstroms (100 Å) thick. This enables the electrons in the floating gate 230 to discharge through the gate oxide layer of the erase capacitor 240 by Fowler-Nordheim (FN) tunneling.

One can lower the erase voltage by increasing the ratio of the $C_C$ capacitance of the control capacitor 220 to the $C_E$ capacitance of the erase capacitor 240. However, this degrades the endurance of the memory cell 200. For example, in order to lower the erase voltage to ten volts (10V), the ratio of the $C_C$ capacitance to the $C_E$ capacitance would have to be infinite to get a ten megavolt per centimeter (10 MV/cm) electric field across a gate oxide thickness of one hundred Angstroms (100 Å).

An infinite coupling ratio leads to zero endurance. The prior art memory cell 200 cannot lower the erase voltage below ten volts (10 V). To lower the coupling ratio to improve the endurance of the memory cell requires a much higher voltage on the gate terminal $V_E$ of the erase capacitor 240. For example, in order to decrease the coupling ratio to a value of two to one (2:1), the erase voltage would have to be as high as fifteen volts (15 V) in order to get an electric field of ten megavolts per centimeter (10 MV/cm) across a gate oxide thickness of one hundred Angstroms (100 Å).

Figure 7:
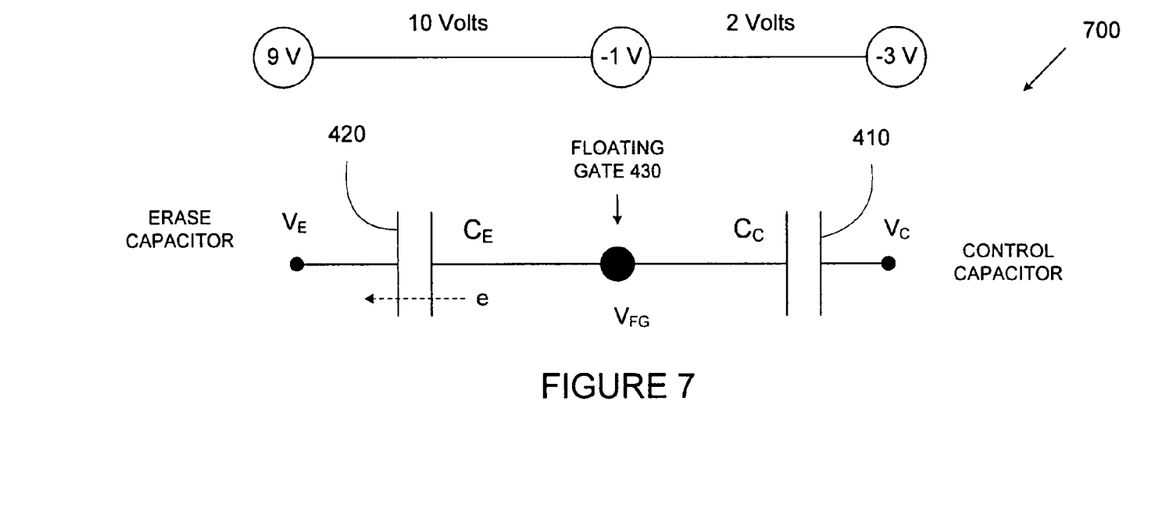
FIG. 7 illustrates a schematic diagram of a portion of a memory cell of the present invention showing an erase operation.

FIG. 7 illustrates a schematic diagram 700 of a portion of a memory cell 400 of the present invention showing an erase operation. As shown in FIG. 7, the erase voltage is split between the control capacitor 410 and the erase capacitor 420. A bias voltage of nine volts (9 V) is placed on the gate terminal $V_E$ of the erase capacitor 240. In addition, a bias voltage of negative three volts (−3 V) is placed on the gate terminal $V_C$ of the control capacitor 410. This arrangement provides a value of ten volts (10 V) across the erase capacitor 420 and a value of two volts (2 V) across the control capacitor 410. The coupling ratio of the control capacitor 410 to the erase capacitor 420 is two to one (2:1). These values of bias voltage and coupling ratio provide an electric field of ten megavolts per centimeter (10 MV/cm) across the gate oxide thickness of one hundred Angstroms (100 Å) in the erase capacitor 420.

The coupling ratio of two to one (2:1) is significantly reduced from the relatively high prior art value of ten to one (10:1). This reduction in coupling ratio improves the endurance of the memory cell 400. In addition, the amplitude of the voltage at each terminal is lower than the prior art voltage values shown in the respective terminals of the memory cell 200 shown in FIG. 6. The lower voltage amplitudes in the present invention enable a designer to reduce the size of peripheral high voltage circuitry on a chip without decreasing the erase speed. The same Fowler-Nordheim (FN) tunneling erase speed is provided because the same electric field strength of ten megavolts per centimeter (10 MV/cm) is achieved.

The bias voltage of nine volts (9 V) that is placed on the gate terminal $V_E$ of the erase capacitor 240 and the bias voltage of negative three volts (−3 V) that is placed on the gate terminal $V_C$ of the control capacitor 410 are exemplary values of bias voltage. It is understood that the invention is not limited to these specific values of bias voltage. It is understood that other values of bias voltage may also be used in the method of the present invention.

Figure 8:
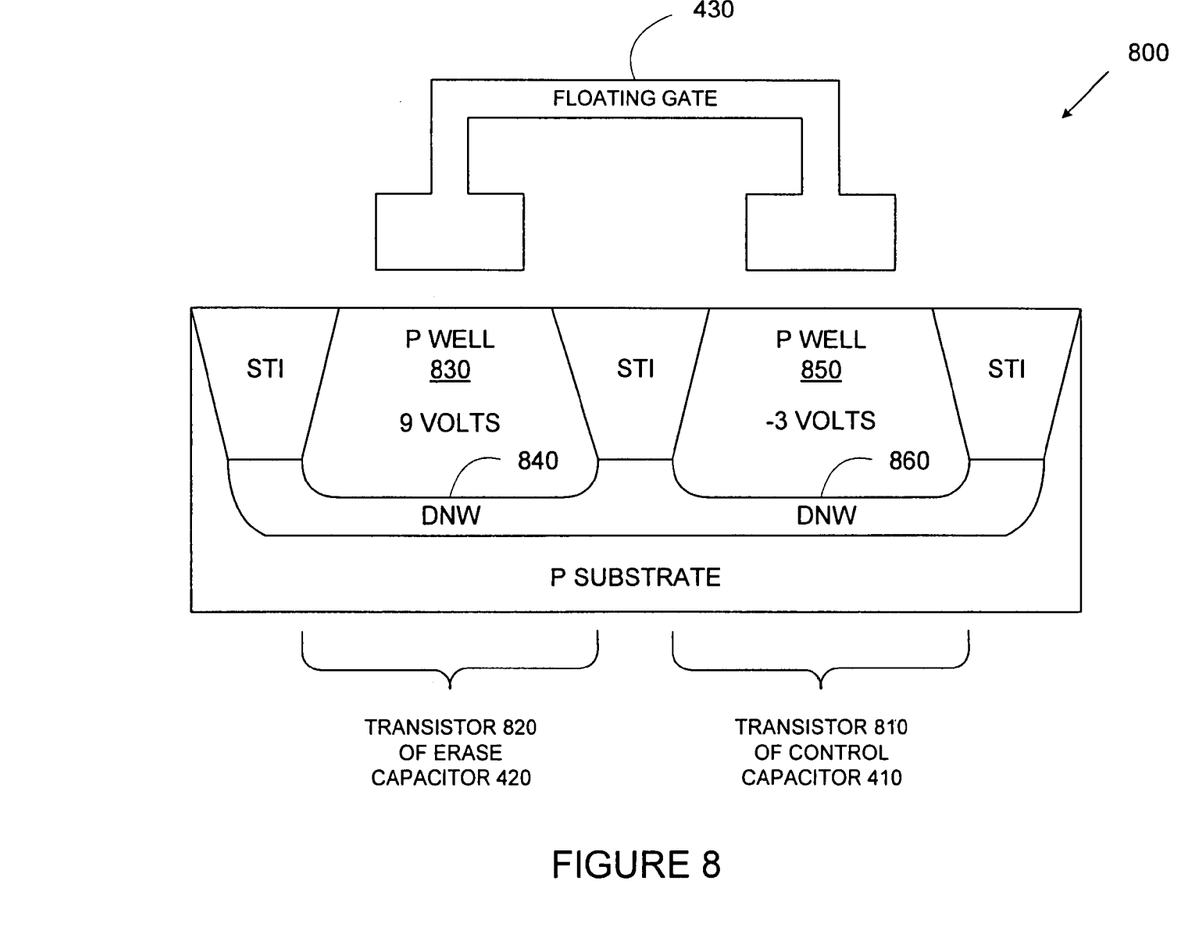
FIG. 8 illustrates a schematic diagram showing a cross sectional view of an NMOS transistor of the control capacitor of the present invention and an NMOS transistor of the erase capacitor of the present invention showing that the transistors are isolated from an underlying P substrate by a Deep N Well isolation structure.

FIG. 8 illustrates a schematic diagram 800 showing a cross sectional view of an NMOS transistor 810 of the control capacitor 410 of the present invention and an NMOS transistor 820 of the erase capacitor 420 of the present invention. FIG. 8 shows that the transistors (810, 820) are isolated from an underlying P substrate by a Deep N Well isolation structure.

The present invention employs NMOS transistors instead of PMOS transistors. Because CMOS fabrication methods generally use a P type substrate, the P wells of NMOS transistors are usually shorted to the wafer substrate. The method of the present invention would not work if normal (default) CMOS fabrication methods were employed. Therefore, the present invention provides a structure that prevents the P wells of the NMOS transistors from being shorted to the wafer substrate.

FIG. 8 shows the Deep N Well ("DNW") isolation structure that is used to isolate the P wells (830, 850) of the NMOS transistors (810, 820). FIG. 8 shows a cross sectional view of the NMOS transistor 810 of control capacitor 410 and a cross sectional view of an NMOS transistor 820 of erase capacitor 420. The gate oxide layers are not shown in FIG. 8.

NMOS transistor 820 of erase capacitor 420 is located in a first P well 830 over Deep N Well 840. NMOS transistor 810 of control capacitor 410 is located in a second P well 850 over Deep N Well 860. The NMOS transistor 810 and the NMOS transistor 820 are isolated by shallow trench isolation structures (designated with the letters "STI" in FIG. 8). When a bias voltage (whether $V_C$ or $V_E$ or $V_P$) is applied to a P well, the Deep N Well under the P well isolates the P well from the P substrate and from other active elements on the wafer.

As shown in FIG. 8, a value of bias voltage equal to a negative three volts (−3V) is applied to the P well 850 of the control capacitor 410. A value of bias voltage equal to a positive nine volts (9 V) is applied to the P well 830 of the erase capacitor 420.

All memory cells that are located in different isolated P wells can share one Deep N Well in a large size array of memory cells. For this reason the implementation of the Deep N Well design in the manufacture of EEPROM memory cells of the present invention does not increase the size of the memory cells. This is in contrast to the memory cell size increase that is required when PMOS transistors are used (as in the prior art). The EEPROM memory cell design of the present invention is very "portable" in that it may be easily and inexpensively employed in Deep N Well CMOS platforms.

The apparatus and method of the present invention can lower the coupling ratio to two to one (2:1). This value of coupling ratio is close to the one and two tenths to one (1.2:1) coupling ratio that is used in mainstream stacked gate flash memory. Considering just the erase operation, the endurance of the memory cell 400 of the present invention is comparable to the endurance of mainstream stacked gate flash memory.

Even when the oxide damage that occurs during program operations is taken into account, the endurance of the EEPROM memory cell 400 of the present invention exhibits a high level of endurance (as measured by the number of program/erase cycles that can be performed). The EEPROM memory cells 400 of the present invention are capable of performing between ten thousand (10,000) program/erase cycles and one hundred thousand (100,000) program/erase cycles. One major reason for the high endurance level is that the EEPROM memory cell 400 of the present invention uses a lower value of coupling ratio with the Fowler-Nordheim (FN) tunneling method to carry out erase operations. The level of endurance of the present invention is significantly higher than the one thousand (1,000) program/erase cycles that are usually obtained by prior art CMOS compatible EEPROM devices.

Figure 9:
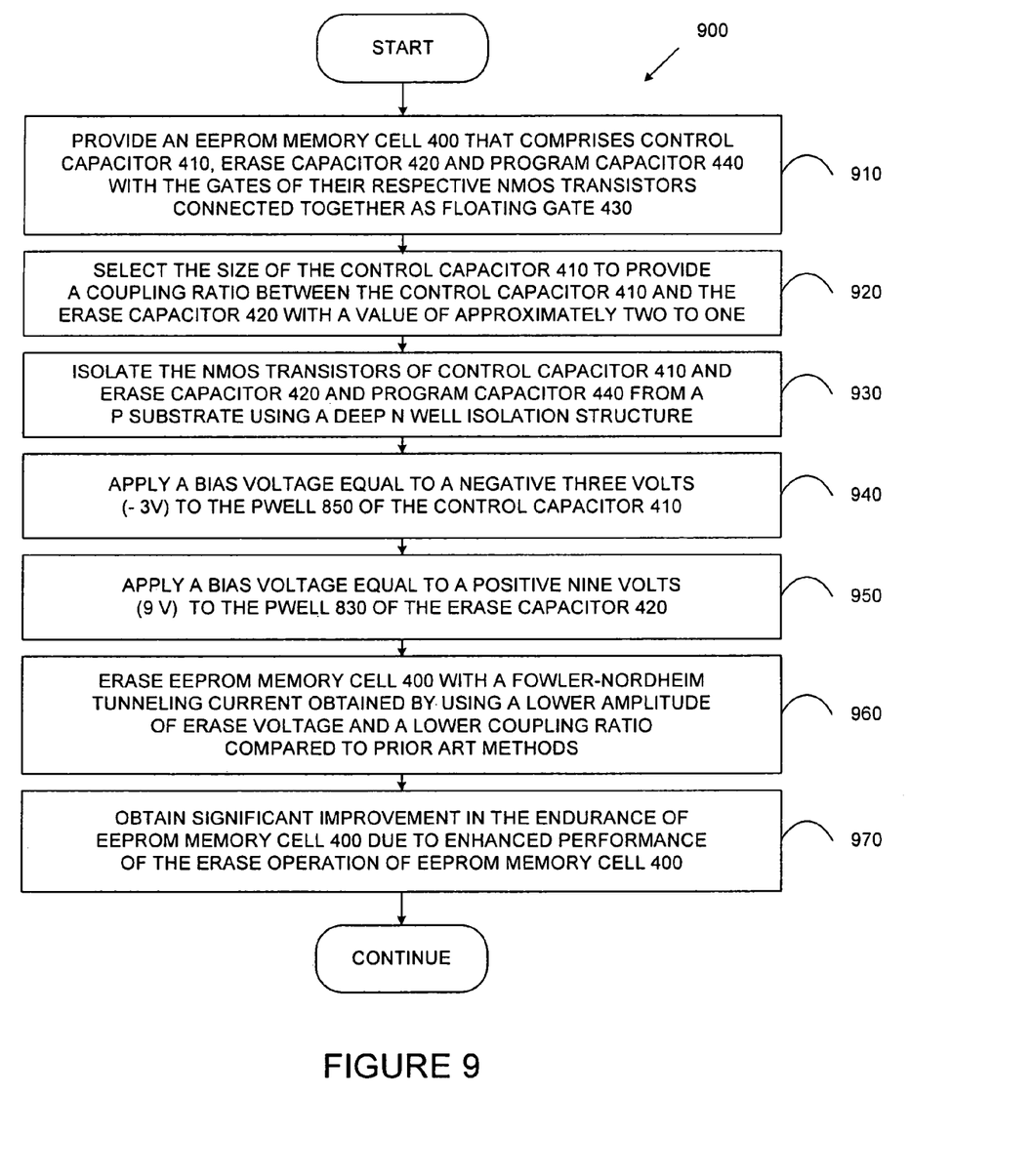
FIG. 9 illustrates a flow chart showing the steps of an advantageous embodiment of the method of the present invention.

FIG. 9 illustrates a flow chart 900 showing the steps of an advantageous embodiment of the method of the present invention. An EEPROM memory cell 400 of the present invention is provided that comprises a control capacitor 410, an erase capacitor 420 and a program capacitor 440 in which the gates of their respective NMOS transistors are connected together as floating gate 430 (step 910). The size of the control capacitor 410 is selected to provide a coupling ratio between the control capacitor 410 and the erase capacitor 420 with a value of approximately two to one (step 920).

The respective NMOS transistors of the control capacitor 410 and the erase capacitor 420 and the program capacitor 440 are isolated from an underlying P substrate by using a Deep N Well isolation structure (step 930). A bias voltage equal to a negative three volts (−3 V) is applied to the P well 850 of the control capacitor 410 (step 940). A bias voltage equal to a positive nine volts (9 V) is applied to the P well 830 of the erase capacitor 420 (step 950).

The EEPROM memory cell 400 is then erased with a Fowler-Nordheim (FN) tunneling current that is obtained by using a lower amplitude of erase voltage and a lower coupling ratio compared to prior art methods (step 960). Significant improvement in the endurance of the EEPROM memory cell 400 is obtained due to the enhanced performance of the erase operation of the EEPROM memory cell 400 (step 970).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell comprising:
   a control capacitor comprising a first NMOS transistor;
   an erase capacitor comprising a second NMOS transistor;
   a floating gate formed by coupling together a gate of said first NMOS transistor and a gate of said second NMOS transistor;
   a deep N well isolation structure that isolates a first P well of said first NMOS transistor and isolates a second P well of said second NMOS transistor from other elements of said memory cell;
   wherein a size of said control capacitor is selected to minimize a coupling ratio with respect to said erase capacitor without decreasing an erase operation performance of said memory cell.

2. The memory cell as claimed in claim 1, wherein said erase operation of said memory cell is performed by a Fowler-Nordheim erase process.

3. The memory cell as claimed in claim 1, wherein said size of said control capacitor is selected to create a coupling ratio with respect to said erase capacitor of two to one.

4. The memory cell as claimed in claim 1, wherein an erase voltage is selected for said memory cell that minimizes an amplitude of said erase voltage without decreasing said erase operation performance of said memory cell.

5. The memory cell as claimed in claim 4, wherein said erase voltage comprises:
   a negative voltage applied to said first P well of said first NMOS transistor of said control capacitor; and
   a positive voltage applied to said second P well of said second NMOS transistor of said erase capacitor.

6. The memory cell as claimed in claim 5, wherein said negative voltage comprises a value of negative three volts and said positive voltage comprises a value of positive nine volts.

7. The memory cell as claimed in claim 4, wherein said size of said control capacitor is selected to create a coupling ratio with respect to said erase capacitor of two to one.

8. An electrically erasable programmable read only memory (EEPROM) device that comprises at least one memory cell that comprises:
   a control capacitor comprising a first NMOS transistor;
   an erase capacitor comprising a second NMOS transistor;
   a floating gate formed by coupling together a gate of said first NMOS transistor and a gate of said second NMOS transistor;
   a deep N well isolation structure that isolates a first P well of said first NMOS transistor and isolates a second P well of said second NMOS transistor from other elements of said memory cell;
   wherein a size of said control capacitor is selected to minimize a coupling ratio with respect to said erase capacitor without decreasing an erase operation performance of said memory cell.

9. The electrically erasable programmable read only memory (EEPROM) device as claimed in claim 8, wherein said erase operation of said memory cell is performed by a Fowler-Nordheim erase process.

10. The electrically erasable programmable read only memory (EEPROM) device as claimed in claim 8, wherein said size of said control capacitor is selected to create a coupling ratio with respect to said erase capacitor of two to one.

11. The electrically erasable programmable read only memory (EEPROM) device as claimed in claim 8, wherein an erase voltage is selected for said memory cell that minimizes an amplitude of said erase voltage without decreasing said erase operation performance of said memory cell.

12. The electrically erasable programmable read only memory (EEPROM) device as claimed in claim 11, wherein said erase voltage comprises:

a negative voltage applied to said first P well of said first NMOS transistor of said control capacitor; and a positive voltage applied to said second P well of said second NMOS transistor of said erase capacitor.

13. The electrically erasable programmable read only memory (EEPROM) device as claimed in claim 12, wherein said negative voltage comprises a value of negative three volts and said positive voltage comprises a value of positive nine volts.

14. The electrically erasable programmable read only memory (EEPROM) device as claimed in claim 11, wherein said size of said control capacitor is selected to create a coupling ratio with respect to said erase capacitor of two to one.

15. A method of operating an electrically erasable programmable read only memory (EEPROM) memory cell, said method comprising the steps of:

connecting a gate of a first NMOS transistor of a control capacitor and a gate of a second NMOS transistor of an erase capacitor to form a floating gate;

providing a deep N well isolation structure that isolates a first P well of said first NMOS transistor and isolates a second P well of said second NMOS transistor from other elements of said memory cell; and selecting a size of said control capacitor to minimize a coupling ratio with respect to said erase capacitor without decreasing an erase operation performance of said memory cell.

16. The method as claimed in claim 15, further comprising the step of erasing said memory cell using a Fowler-Nordheim erase process.

17. The method as claimed in claim 15, wherein said size of said control capacitor is selected to create a coupling ratio with respect to said erase capacitor of two to one.

18. The method as claimed in claim 15, further comprising the step of:

selecting an erase voltage for said memory cell that minimizes an amplitude of said erase voltage without decreasing said erase operation performance of said memory cell.

19. The method as claimed in claim 18, wherein said erase voltage comprises:

a negative voltage applied to said first P well of said first NMOS transistor of said control capacitor; and a positive voltage applied to said second P well of said second NMOS transistor of said erase capacitor.

20. The method as claimed in claim 19, wherein said negative voltage comprises a value of negative three volts and said positive voltage comprises a value of positive nine volts.

* * * * *